United States Patent
Chen et al.

[11] Patent Number: 6,077,763
[45] Date of Patent: *Jun. 20, 2000

[54] PROCESS FOR FABRICATING A SELF-ALIGNED CONTACT

[75] Inventors: Hwi-Huang Chen; Gary Hong, both of Hsinchu, Taiwan

[73] Assignee: United Microelectronics Corp., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/752,627

[22] Filed: Nov. 19, 1996

[51] Int. Cl.⁷ ................. H01L 21/8238; H01L 21/3205; H01L 21/4763
[52] U.S. Cl. .................. 438/595; 438/211; 438/216; 438/586; 438/587; 438/592
[58] Field of Search .................................. 438/586, 587, 438/591, 592, 595, 253, 211, 257, 216

[56] References Cited

U.S. PATENT DOCUMENTS

| | | | |
|---|---|---|---|
| 5,707,901 | 1/1998 | Cho et al. | 438/595 |
| 5,783,471 | 7/1998 | Chu et al. | 438/257 |
| 5,792,687 | 8/1998 | Jeng et al. | 438/253 |
| 5,821,573 | 10/1998 | Schunke et al. | 257/296 |

*Primary Examiner*—John F. Niebling
*Assistant Examiner*—Ha Tran Nguyen
*Attorney, Agent, or Firm*—Rabin & Champagne, P.C.

[57] ABSTRACT

A process of fabricating self-aligned contacts for a semiconductor memory IC device. The substrate of the memory device has formed thereon gate structures of the memory cell units for the memory device. The gate structures are regularly spaced apart by first sidewall spacers formed on sidewalls of the gate structures. Source/drain regions of the memory cell units are formed in the device substrate in regions between consecutive gate structures. The process includes first forming an insulating layer over the surface of the substrate, followed by anisotropically etching back the insulating layer until a predetermined thickness over and normal to the top surface of the gate structure is obtained. A photoresist layer is formed over the surface of the insulating layer, with openings exposing contact regions for the memory cell units. Second sidewall spacers are then formed on the sidewalls of the gate structures and the source/drain regions are exposed, by etching into the insulating layer through the openings. The second sidewall spacers cover the first sidewall spacers. Contacts are then formed for the memory cell units, in direct electrical contact with the source/drain regions.

8 Claims, 3 Drawing Sheets

PROCESS FOR FABRICATING A SELF-ALIGNED CONTACT

BACKGROUND OF THE INVENTION

1. Field of the Invention

The invention relates in general to the fabrication of a semiconductor memory for an integrated circuit (IC) device. In particular, the invention relates to a process for fabricating a self-aligned contact for a memory IC device, having an improved performance and fabrication yield rate.

2. Description of the Related Art

Among semiconductor IC fabrication processes for memory devices, a known technique using what is known as a "self-aligned contact" is widely employed to reduce the surface area of the layout of the device memory cell units. Smaller memory cell units may be directly translated into higher memory density for the device fabricated. FIGS. 1A–1C of the accompanying drawings are cross-sectional views depicting a self-aligned contact at successive steps of fabrication by a conventional process.

As is shown in the drawing, a memory cell is fabricated in a semiconductor substrate 10, which can be a P-type silicon substrate or a P-well region in a silicon substrate. A gate dielectric layer 11 for the memory cell unit may be a silicon oxide layer obtained, for example, by performing a thermal oxidation on the surface layer of the silicon substrate 10. A polysilicon layer 12 constitutes the gate electrode of the memory cell unit. The surface of the polysilicon layer 12 is thermally oxidized or silicon oxide is deposited, to provide a silicon oxide layer 13 thereon. Sidewall spacers 14 may be formed on the sidewalls of the memory cell unit gate structure, including the gate dielectric layer 11, the polysilicon gate electrode 12, and the silicon oxide layer 13. Lightly-doped regions 15 and heavily-doped regions 16 are formed in the substrate 10 at designated locations, wherein each of the heavily-doped regions is formed inside its respective lightly-doped counterpart. Each pair of a lightly-doped region and a heavily-doped region constitutes a source/drain region for a memory cell transistor.

After the formation of the basic construction for the memory cell unit is concluded in the substrate 10, as shown in FIG. 1A, a silicon oxide layer 17 is deposited over the entire surface of the substrate, followed by the application of a layer of photoresist 100 by a spin coating procedure. Photolithography is then performed to define a designated pattern in the photoresist layer, so that an opening 110 reveals the surface of the silicon oxide layer 17. Afterwards, as shown in FIG. 1B, the photoresist layer 100 is utilized as a shielding mask during a dry etching procedure, whereby the silicon oxide layer 17 exposed inside the opening 110 of the photoresist layer 100 is consumed, leaving residual portions of the oxide on the sidewalls of the memory cell gate structure. This forms second sidewall spacers 18 for the gate structure, over the previously formed first sidewall spacers 14. The etching is controlled to consume the silicon oxide layer 17 until the surface of the heavily-doped region 16 in the opening 110, between two consecutive gate structures of the memory cell, is revealed. Then, the photoresist layer 100 may be removed. At this stage, another polysilicon layer is deposited over the entire surface of the substrate. The deposited polysilicon layer directly contacts the heavily-doped region 16, which is exposed in the opening 110. As is seen in FIG. 1C, this deposited second polysilicon layer may then be patterned using photolithography and etching to form a configuration as shown in the drawing. This configuration constitutes a contact 19 for the memory cell, and is used as the bit line contact for the memory cell array of the device being fabricated.

Since the thickness of the deposited silicon layer 17 determines the width of the second sidewall spacer 18, therefore, the larger is the thickness of the deposited silicon layer 17, the larger the width of the sidewall spacer 18 will be, and the reverse is also true. When the factor of electrical insulation between contact 19 and gate electrode 12 is considered, it can be understood that the larger the thickness of the deposited polysilicon layer 17 is, the more effective the insulation will be. In addition, the parasitic capacitance will also be smaller. However, a thick polysilicon layer 17 would result in a large gradient discrepancy in the vertical direction for the configuration of the sidewall spacers. This increases the aspect ratio for the subsequent metallization steps of the device fabrication, and increases the level of difficulty in performing metal sputtering. The subsequent planarization would also be worse.

SUMMARY OF THE INVENTION

It is therefore an object of the invention to provide a process for fabricating self-aligned contacts for a semiconductor memory IC device having an improved performance and fabrication yield rate, by improving the insulation between the bit line contact and the gate electrode for each memory cell unit.

It is another object of the invention to provide a process for fabricating self-aligned contacts for a semiconductor IC device, having an improved performance and fabrication yield rate by reducing the parasitic capacitance between the bit line contact and the gate electrode for each memory cell unit.

The invention achieves the above-identified objects by providing a process for fabricating self-aligned contacts for a semiconductor memory IC device. The substrate of the memory device has formed thereon gate structures of the memory cell units for the memory device. The gate structures are regularly spaced apart by first sidewall spacers formed on sidewalls of the gate structures. Source/drain regions of the memory cell units are formed in the device substrate in regions between consecutive gate structures. The process includes first forming an insulating layer over the surface of the substrate, followed by anisotropically etching back the insulating layer until a predetermined vertical thickness is obtained, particularly over and normal to the top surface of the gate structure. A photoresist layer is then formed over the surface of the insulating layer with openings defined in the photoresist layer, that expose portions of the insulating layer corresponding to contact regions for the memory cell units over the source/drain regions. Second sidewall spacers are then formed on the sidewalls of the gate structures by etching into the insulating layer through the openings, via exposure of the photoresist layer, to expose the source/drain regions. The second sidewall spacers cover the first sidewall spacers. Contacts are then formed for the memory cell units in direct electrical contact with the source/drain regions.

BRIEF DESCRIPTION OF THE DRAWINGS

Other objects, features, and advantages of the invention will become apparent from the following detailed description of the preferred but non-limiting embodiments, with reference to the accompanying drawings, in which.

DESCRIPTION OF THE PREFERRED EMBODIMENT

A preferred embodiment of the invention for the process of fabrication of self-aligned contacts for a semiconductor IC memory device is described below with reference to FIGS. 2A–2D of the drawings.

Figure 2A:
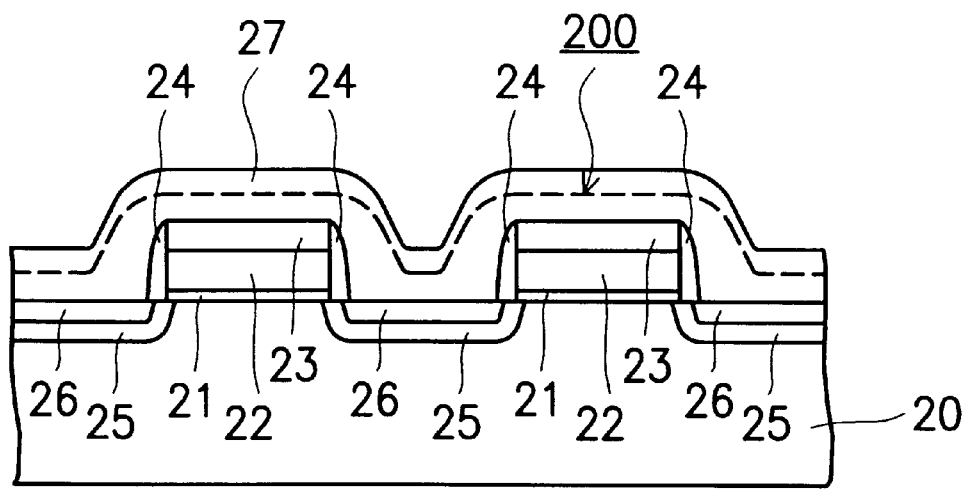
FIGS. 2A–2D are cross-sectional views of a self-aligned contact for a semiconductor IC device, depicted at respective selected procedural steps of a fabrication process in accordance with a preferred embodiment of the invention.

Essentially, as shown in the drawings, the memory cell units of the memory device are fabricated in a semiconductor substrate 20, which can be a P-type silicon substrate, or a P-well region formed in a silicon substrate. As shown in FIG. 2A, a gate dielectric layer 21 for the memory cell unit may be a silicon oxide layer obtained, for example, by thermally oxidizing the surface layer of the silicon substrate 20. A polysilicon layer 22, to constitute the gate electrode of the memory cell unit, is formed over the gate dielectric layer 21. The surface of the polysilicon layer 22 is thermally oxidized, or silicon oxide may be deposited, to form a silicon oxide layer 23. The silicon oxide layer 23 covers the polysilicon gate electrode 22. Sidewall spacers 24 are then formed on the sidewalls of the memory cell unit gate structure including the gate dielectric layer 21, the polysilicon gate electrode 22, and the silicon oxide layer 23. Lightly-doped regions 25 and heavily-doped regions 26 are formed in the substrate 20 at designated locations, wherein each of the heavily-doped regions is formed inside its respective lightly-doped counterpart. Each pair of a lightly-doped region and a heavily-doped region constitutes a source/drain region for a memory cell transistor.

Figure 1A:
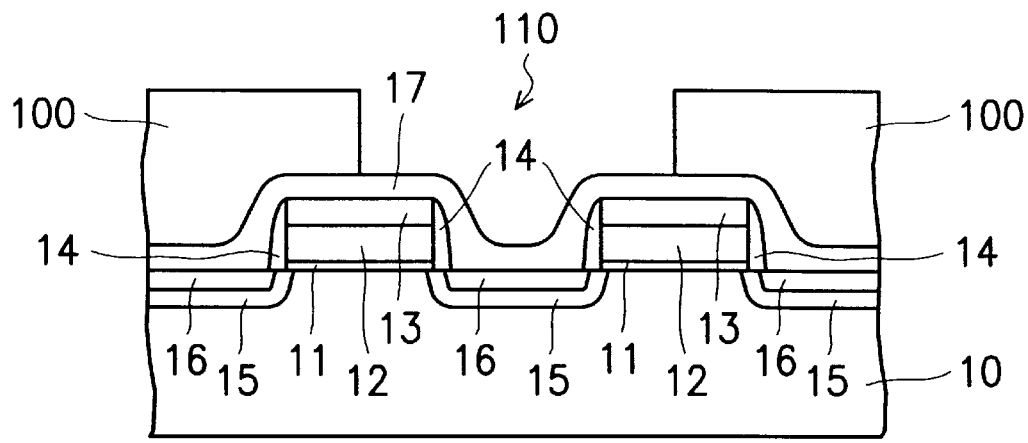
FIGS. 1A–1C are cross-sectional views of a self-aligned contact for a semiconductor IC device, depicted at respective selected procedural steps of a conventional fabrication process.
Figure 1B:
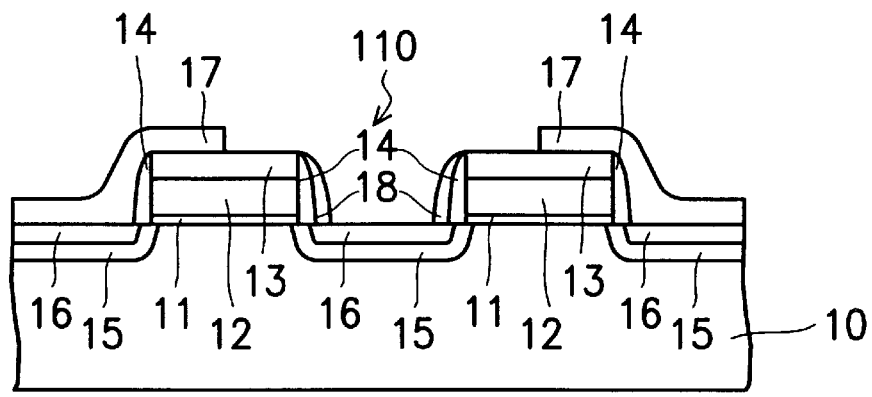
Figure 1C:
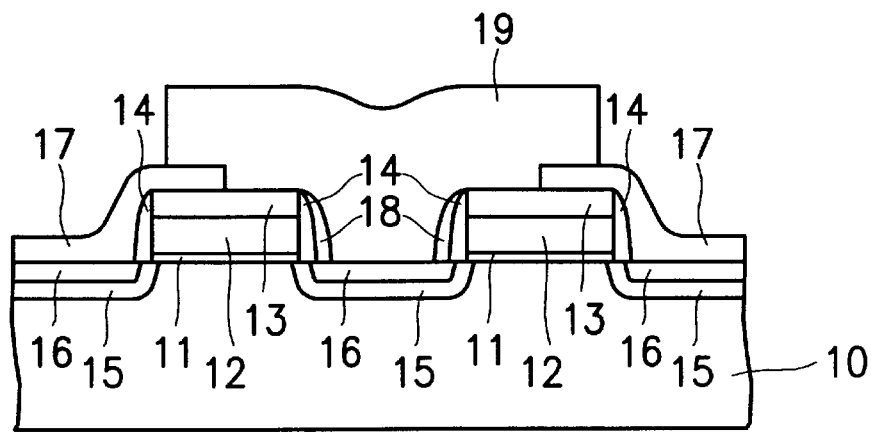

Still in FIG. 2A, after the basic construction for the memory cell unit is concluded in the substrate 20, an insulating layer 27 is deposited to cover the entire surface of the substrate. The insulating layer 27 may, for example, be a silicon oxide layer having a thickness in the range of about 3,000–6,000 Å, particularly over and normal to the top surface of the gate structures. This is a thickness typically larger than the corresponding layer used in the conventional fabrication process of comparable memory devices, such as the silicon oxide layer 17 depicted in FIGS. 1A–1C. An anisotropic etching procedure is then employed to etch back a surface layer of the surface of the insulting layer 27. The consumption resulting from the etch-back procedure shapes the insulating layer to a configuration having a smaller thickness, as is schematically shown in FIG. 2A by the phantom line 200. In accordance with the invention, the vertical portion of the insulating layer 27 consumed by the anisotropic etch-back procedure has a thickness of about 800–2,000 Å, particularly over and normal to the top surface of the gate structures, if the originally-deposited insulating layer has a thickness of about 3,000–6,000 Å, as mentioned above. The lateral thickness of the insulating layer 27 consumed at the sides of the gate structures is less than in the vertical direction. This is a thickness considered to be optimal for performing planarization the most effectively in the subsequent fabrication procedural steps.

Figure 2B:
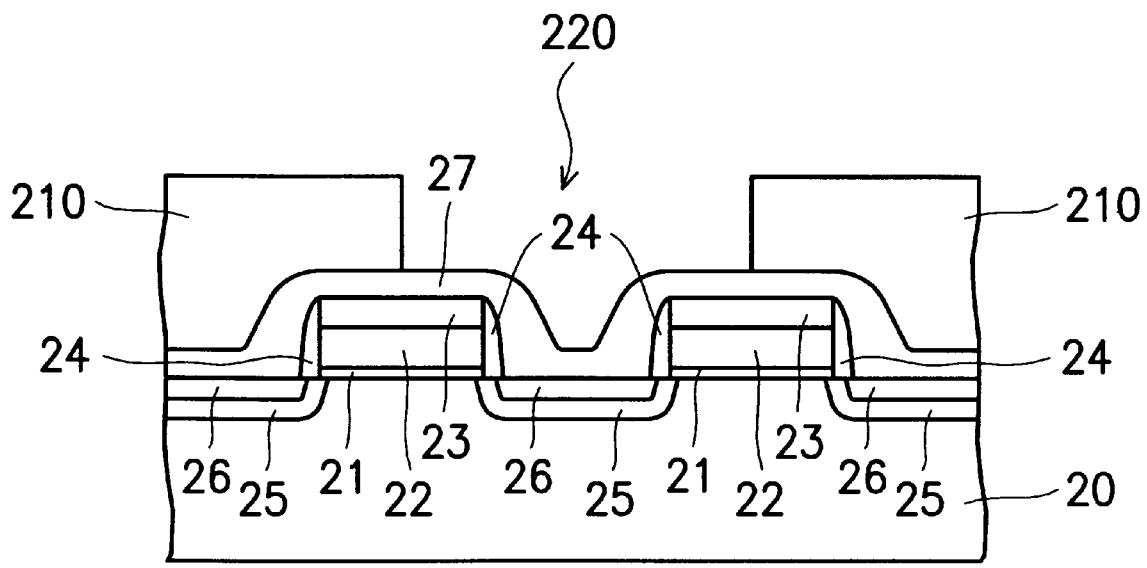
Figure 2C:
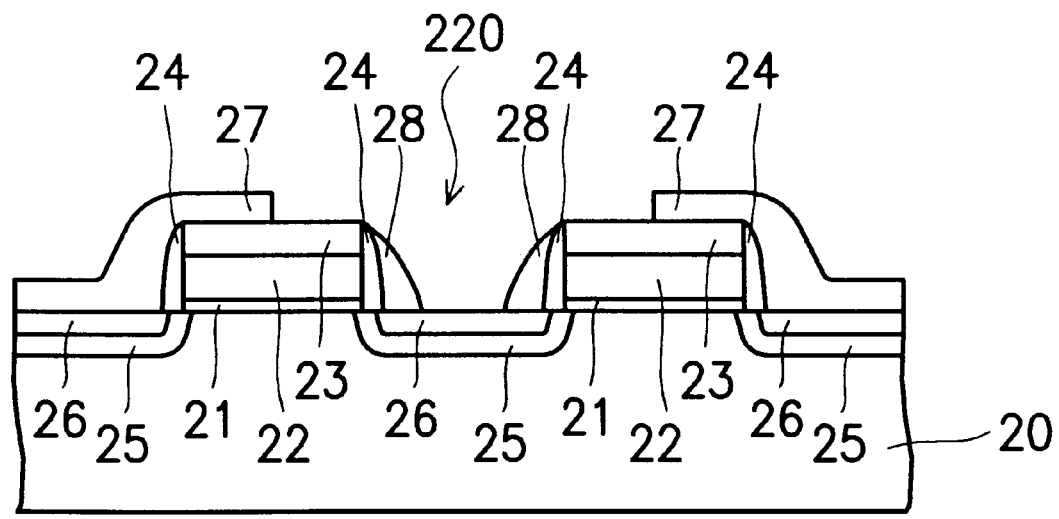

Then, as shown in FIG. 2B, a photoresist layer 210 is applied over the entire surface of the substrate 20. Patterning, image exposure, setting, and baking procedures are then implemented to define the desired pattern in the photoresist layer, so as to form an opening 220 therein. The opening 220 in the photoresist layer 210 exposes the surface of the insulating layer 27. Then, with reference to FIG. 2C, the photoresist layer 210 is utilized as a shielding mask to implement a dry etching operation whereby the exposed portion of the silicon oxide layer 27 inside the opening 220 of the photoresist layer 210 is consumed, leaving residual portions of the insulating oxide on the sidewalls of the memory cell gate structure as second sidewall spacers 28 for the gate structure, over the first sidewall spacers 24. The dry etching procedure is controlled to also consume portions of the insulating layer 27 in the opening 220, until the surface of the heavily-doped region 26 between two consecutive gate structures of the memory cell is exposed. Then, the photoresist layer 210 is removed. Because the lateral thickness of the insulating layer 27 at the sides of the gate structures was not reduced to the same degree as the vertical thickness during the etch-back procedure, the second sidewall spacers 28 are thicker than those of a conventional memory cell.

Figure 2D:
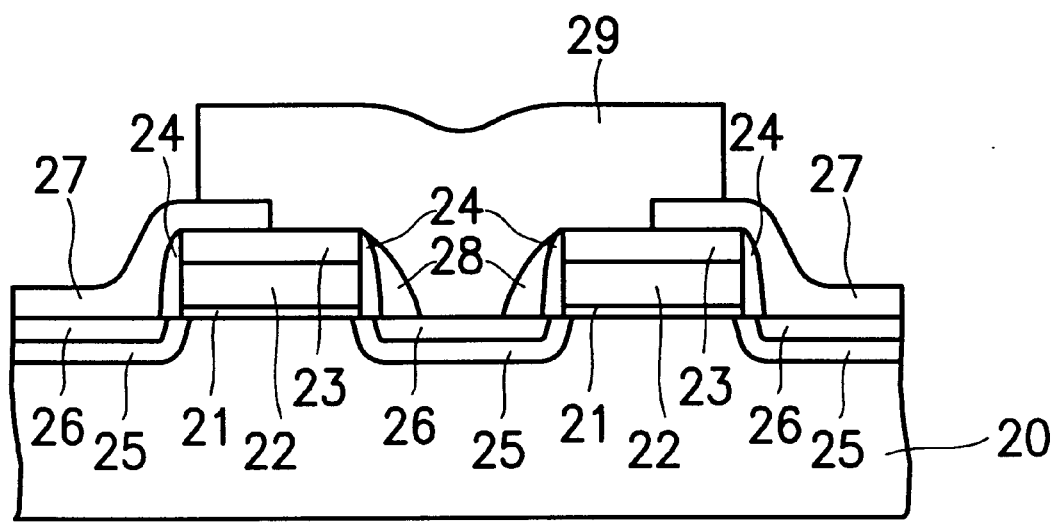

After the formation of the second sidewall spacers 28, an electrically conductive layer is deposited over the entire surface of the substrate. The deposited conductive layer is in direct contact with the portion of the heavily-doped region 26 exposed in the opening 220. This electrically conductive layer may, for example, be a polysilicon or polycide layer. Then, as shown in FIG. 2D, this deposited electrically conductive layer is processed by a photolithography and etching procedure and patterned to form a contact configuration for the memory cell serving as a bit line contact 29 for the memory cell array of the device being fabricated.

Thus, the process for fabricating self-aligned contacts for semiconductor memory IC devices of the invention, as outlined in the above description of the preferred embodiment, makes use of a deposited insulating layer having a significantly larger thickness that is anisotropically etched back to a normal thickness. An opening in the photoresist layer covering the etched-back insulating layer defines a region for the contact, in which the insulating layer is etched to form second sidewall spacers having larger lateral widths. As persons skilled in the art will well appreciate, this larger sidewall spacer width is directly translated into better insulation between the gate electrode and the contact region. Parasitic capacitance between the gate electrode and the contact region will therefore be substantially reduced. Further, the aspect ratio of the subsequently deposited metallization would not be increased, since the thickness of the insulating layer in the vertical direction is reduced to a normal thickness as the etch-back procedure progresses. The result is a better planarization effectiveness in the subsequent processing.

While the invention has been described by way of example and in terms of a preferred embodiment, it is to be understood that the invention is not limited to the disclosed embodiment. To the contrary, it is intended to cover various modifications and similar arrangements, and the appended claims should be accorded the broadest interpretation so as to encompass all such modifications and similar arrangements.

What is claimed is:

1. A process for fabricating self-aligned contacts for a semiconductor memory integrated circuit device in a substrate, wherein the substrate has formed thereon a plurality of regularly spaced apart gate structures of memory cell units of the memory device, the gate structures having upper surfaces above a substrate surface and sidewalls between the upper surfaces and the substrate surface, first sidewall spacers being located on sidewalls of the gate structures, and source/drain regions of the memory cell units being located in the substrate in regions between consecutive gate structures; the process comprising:

forming an insulating layer over the substrate surface;

anisotropically etching back the insulating layer until the insulating layer over the top surface of the gate structure has a predetermined thickness measured normal to the substrate;

forming a photoresist layer over a surface of the insulating layer, with openings defined in the photoresist layer exposing the insulating layer over the source/drain regions;

etching into the insulating layer through the openings so as to expose the source/drain regions and form second sidewall spacers covering the first sidewall; and forming the contacts for the memory cell units in direct electrical contact with the source/drain regions.

2. The process of fabricating self-aligned contacts of claim 1, wherein the insulating layer is formed abutting the gate structures and the first sidewall spacers.

3. The process of fabricating self-aligned contacts of claim 2, wherein the insulating layer is a silicon oxide layer with a thickness in the range of about 3,000–6,000 Å.

4. The process of fabricating self-aligned contacts of claim 3, wherein said anisotropically etching back the insulating layer includes anisotropically etching back the silicon oxide layer to consume a surface layer having a thickness over the top surface of the gate structure in a direction normal to the top surface in the range of about 800–2,000 Å.

5. The process of fabricating self-aligned contacts of claim 1, wherein the contacts are formed of a polysilicon layer.

6. The process of fabricating self-aligned contacts of claim 1, wherein the contacts are formed of a polycide layer.

7. The process of fabricating self-aligned contact of claim 1, wherein each of the plurality of gate structures comprises a gate dielectric layer, a gate electrode, and a silicon oxide layer, stacked successively.

8. The process of fabricating self-aligned contact of claim 1, wherein each of the source/drain regions comprises a heavily-doped region enclosed by a larger lightly-doped region.

* * * * *